United States Patent [19]
Ermisch et al.

[11] Patent Number: 5,883,508
[45] Date of Patent: Mar. 16, 1999

[54] VOLTAGE TRANSFORMER WITH VOLTAGE DIVIDER FOR MEASURING VOLTAGE IN MEDIUM HIGH AND HIGH VOLTAGE INSTALLATIONS

[75] Inventors: Jochen Ermisch, Radebeul; Axel Georgi, Oberwartha, both of Germany

[73] Assignee: Duromer Kunststoffverarbeitungs-GmbH, Ottendorf-Okrilla, Germany

[21] Appl. No.: 913,922
[22] PCT Filed: Nov. 10, 1995
[86] PCT No.: PCT/EP95/04431
§ 371 Date: Sep. 5, 1997
§ 102(e) Date: Sep. 5, 1997
[87] PCT Pub. No.: WO96/28736
PCT Pub. Date: Sep. 19, 1996

[30] Foreign Application Priority Data

Mar. 13, 1995 [DE] Germany .................. 195 08 582.5

[51] Int. Cl.⁶ .................. H01F 38/24; G01R 1/14
[52] U.S. Cl. .................. 323/359; 324/126
[58] Field of Search .................. 323/359; 324/126, 324/127

[56] References Cited

U.S. PATENT DOCUMENTS

| | | | |
|---|---|---|---|
| 5,220,495 | 6/1993 | Zulaski | 323/258 |
| 5,241,260 | 8/1993 | Beland | 323/258 |

FOREIGN PATENT DOCUMENTS

| | | | |
|---|---|---|---|
| 29 30 767 | 2/1981 | Germany | G01R 1/20 |
| 2930672C2 | 2/1985 | Germany | G01R 15/04 |

*Primary Examiner*—Peter S. Wong
*Assistant Examiner*—Bao Q. Vu
*Attorney, Agent, or Firm*—Michael J. Striker

[57] ABSTRACT

A voltage transformer with a voltage divider for measuring the voltage in medium high voltage and high voltage installations have a combined arrangement of an ohmic divider resistor and elements for compensating ambient electromagnetic effects, and the divider resistor is made of one peace with a measuring resistor and with taps, wherein at least one tap is connected with at least compensation element.

22 Claims, 5 Drawing Sheets

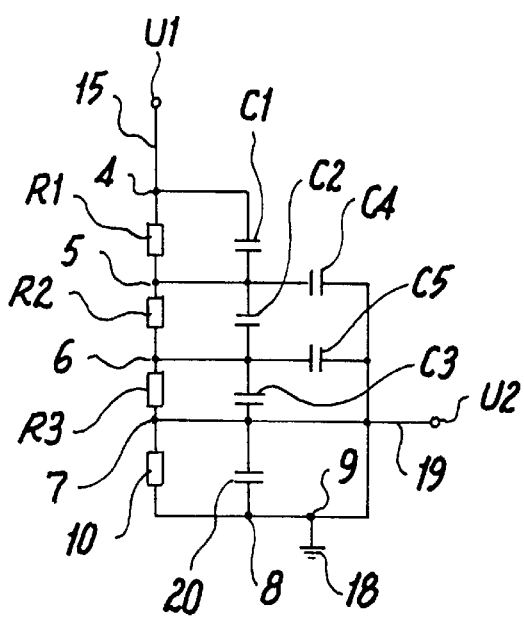
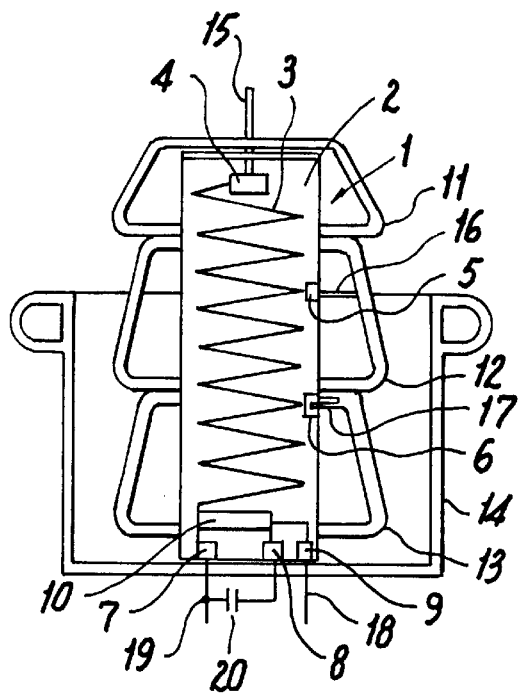
Fig. 1A  Fig. 1B
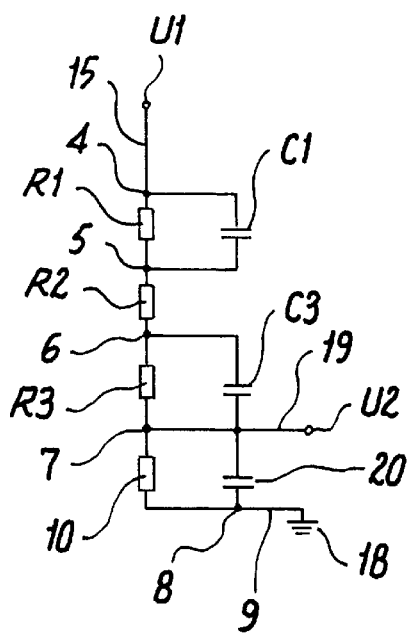
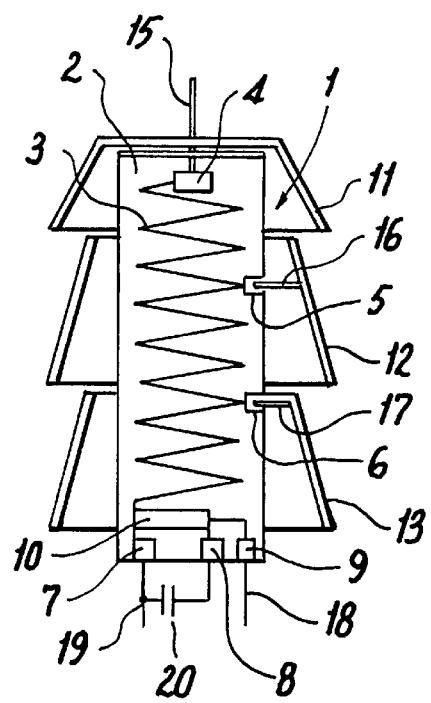
Fig. 2A  Fig. 2B

VOLTAGE TRANSFORMER WITH VOLTAGE DIVIDER FOR MEASURING VOLTAGE IN MEDIUM HIGH AND HIGH VOLTAGE INSTALLATIONS

BACKGROUND OF THE INVENTION

The invention relates to a voltage transformer with a voltage divider for measuring the voltage in medium high voltage and high voltage installations, having a combined arrangement of an ohmic divider resistor and means for compensating ambient electromagnetic effects.

Such voltage transformers with voltage dividers are known from DE 29 30 672 C2 or DE-OS 29 30 767. The known voltage divider consists of lens-shaped resistor elements which each have a central opening. With their central openings the resistor elements have been placed on a common threaded bolt, by means of which they are maintained together and fastened. Capacitively effective electrodes are also fastened on the same threaded bolt by being clamped between the lens-shaped resistor elements. The electrodes keep interferences by capacitive influences of the surroundings away from the voltage divider. The known device is expensive to produce, since the individual resistor elements must be individually produced and assembled. This applies even more so in connection with the coating of the resistor elements by means of a thick film resistance paste suggested by the mentioned references. This coating must be applied individually to each resistor element.

SUMMARY OF THE INVENTION

It is the object of the invention to disclose a voltage transformer which is insensitive to ambient electromagnetic influences, is simply constructed and can be produced with small outlay.

This object is attained in accordance with the invention in that a divider resistor is made of one piece with a measuring resistor and with taps and is sputtered in the form of a metal material on a supporting material or is produced in accordance with thick film technology, wherein at least one tap is connected with at least one compensation element. In connection with the subject of the invention, the voltage divider can be advantageously produced in a simple way in a single process step by coating a supporting material, wherein the measuring resistor and the taps for the compensation elements are simultaneously produced. It is merely necessary to connect the compensation elements with the said taps to form the voltage transformer.

A voltage transformer in accordance with the invention can be considerably smaller and lighter, and can be produced with less effort. In addition, because of its small size and the production methods it is possible to integrate further additional components, circuit connections and passive components in the course of the thick film process. When using the voltage transformer in switchgear, it is possible to design the entire switch cell smaller and more compact.

A further important advantage is the low-output design, because of which an effective cooperation with modern versions of information processing, for example in switchgear technology, is assured. Furthermore, with the technically uniform embodiment of the high and low voltage resistor of the divider, a uniform coefficient of temperature expansion and a uniform temperature are obtained, with the advantage of a very small temperature dependence of the divider ratio.

In connection with a particularly simple production a preferred embodiment is recommended, wherein the divider resistor is arranged on a flat supporting plate and the taps at the edges of the supporting plate. Other components can be connected particularly easily to the lateral taps.

In order to keep interferences by ambient capacitive effects particularly effectively away from the voltage divider, it is recommended to employ electrodes as the compensation elements which, in respect to their capacitance, are of such a size that accidental capacitive effects and those based on the environment can be defined or compensated to a large extent by a definite electrode design. The capacitive effects on the transmission behavior are compensated by dimensioning a capacitance at the low voltage resistor so that it has a defined relationship with the capacitance at the high voltage resistor.

In this way the transmission behavior in the frequency range 0 . . . 1000 Hz is only affected by exterior sources within predefined error limits. At the same time an electrical field control and shielding against EMC effects is achieved by the design of the capacitively effective electrodes. The capacitive divider being parallel with the ohmic divider as a result of the design furthermore constitutes a protection against a voltage rise at the divider output in case of transient over-voltages.

The direct surface of the thick film resistor is in addition relieved from insulation duties by the electrodes.

In a preferred embodiment, the electrodes are made in accordance with cast resin techniques, wherein the capacitively effective portion is made of conductive synthetic resin layers or by sputter metallization. A complete adaptation in the heat expansion behavior is achieved by means of this.

A further preferred embodiment provides that the capacitive electrodes consist of suitably shaped sheet metal elements, which care connected over short conductors with the taps of the divider resistor. If the capacitive electrodes consist of umbrella-shaped metal elements in particular, a shielding effect is achieved besides the capacitive effects. Sheet metal elements of this kind can be produced and connected in a simple manner and without extra effort.

In another embodiment the capacitively effective electrodes are designed in a semiconductor-capable embodiment, preferably with a surface resistance in the range between $10^8 \ldots 10^{11}$ Ω. The field control effect of the electrodes can be directedly affected in this manner.

In an embodiment of the invention which constitutes a good compromise between a simple construction and good function of the voltage transformer, three umbrella-shaped electrodes are arranged one on top of the other, wherein a first electrode is connected with the high voltage, a second electrode with a second tap of the divider resistor and a third electrode with a third tap.

The arrangement can be further improved by means of a cup-shaped fourth electrode connected with ground potential, which encloses at least the third electrode. In the process further capacitances are formed between the third and possibly second electrode and the ground potential and the voltage transformer is better shielded.

In a variant the fourth electrode can also be connected with the potential of the divider tap at the fourth tap, wherein shielding can be further improved in connection with certain environmental effects.

Under special conditions of the environmental effects a capacitive compensation is only possible up to a certain degree. It is proposed in this case that at least one further resistor be switched parallel with the divider resistor as a compensation element and be disposed in its vicinity. Such a resistor develops a certain shielding effect, which can be especially effective because of its semiconducting properties in particular.

In an advantageous embodiment the further resistor(s) are embodied as a metallic material sputtered on a supporting material or in thick film technology. In this way the further resistor, the same as the voltage divider, can be advantageously simply produced in one process step by coating a supporting material.

In order to simplify the construction of the voltage transformer and to make it more cost-effective, it is recommended that the further resistor(s) are produced in the same design as the divider resistor on a flat supporting plate with taps at the edges of the supporting plate, but wherein only the divider resistor is connected with the measuring connector. Basically several divider resistors are employed here, which can advantageously be produced in the same production facilities. But during assembly only the divider resistor is connected with the measuring connector. The tap for the measuring voltage of the other dividers employed as further resistors is not connected with the measuring connector.

A preferred embodiment provides that four further resistors are arranged in a box shape around the divider resistor, so that in section their supporting plates essentially form a square, in which the divider resistor is diagonally arranged. Because of this arrangement the divider resistor is almost completely semiconductively shielded, so that ambient electromagnetic effects are effectively kept away from the divider resistor by the further resistors.

A simpler embodiment provides that a further resistor is disposed directly next to the divider resistor, so that the two supporting plates extend at a short distance from and essentially parallel with each other. This embodiment requires even fewer components and can be produced even more cost-effectively, wherein still a sufficient compensation effect is achieved by means of the further resistor.

In an again simplified embodiment it is provided that the divider resistor and a further resistor are arranged on the front and back of the same supporting plate. With this embodiment the dividing resistor already brings its compensation element with it, so that a mounting of the further resistor or an assembly can be cost-effectively omitted.

In a further development of the invention, the voltage transformer in accordance with the invention, together with the divider resistor and compensation means, is cast into the material of an insulating element of a switchgear, in particular into an opening or a support for a busbar. A one-piece compact component is created by this which can be used in place of the conventional insulating elements, in particular through guides or supports for busbars. In this case the requirement of providing a voltage transformer with a housing is omitted, and considerable savings in weight and volume result in the switchgear. This embodiment here has the additional advantage that conventional insulating elements can be replaced in the simplest way with insulating elements in accordance with the invention which have voltage transformers.

This applies in particular for supports for busbars in accordance with one of claims 19 or 20, into whose material a voltage transformer in accordance with the invention has been cast.

In a further development of the cast-in voltage transformer it is provided that the resistors, and the divider resistor in particular, are coated with silicon caoutchouc. This measure assures that the resistors, in particular resistors produced in accordance with thick film techniques on a flat supporting plate, are given a certain amount of play, within which slight displacements because of thermal loads of the resistors are possible without having to fear the destruction of the resistors or of the insulating element. At a typical total resistance of 50 MΩ and a voltage of 12 kV, a power loss of approximately 3 W occurs, which leads to a noticeable warming of the resistor of approximately 6° C.

Further advantages and details of the invention result from the following description of exemplary embodiments by means of the drawings.

BRIEF DESCRIPTION OF THE DRAWINGS

Shown in the drawing figures in detail is in:

FIG. 1, a first schematic arrangement of the voltage transformer in accordance with the invention with the associated equivalent circuit diagram, FIG. 2, a second schematic arrangement of the voltage transformer in accordance with the invention with the associated equivalent circuit diagram, FIG. 3, a basic sketch in a perspective view of a third arrangement of a voltage transformer in accordance with the invention.

DESCRIPTION OF PREFERRED EMBODIMENTS

Figure 3:
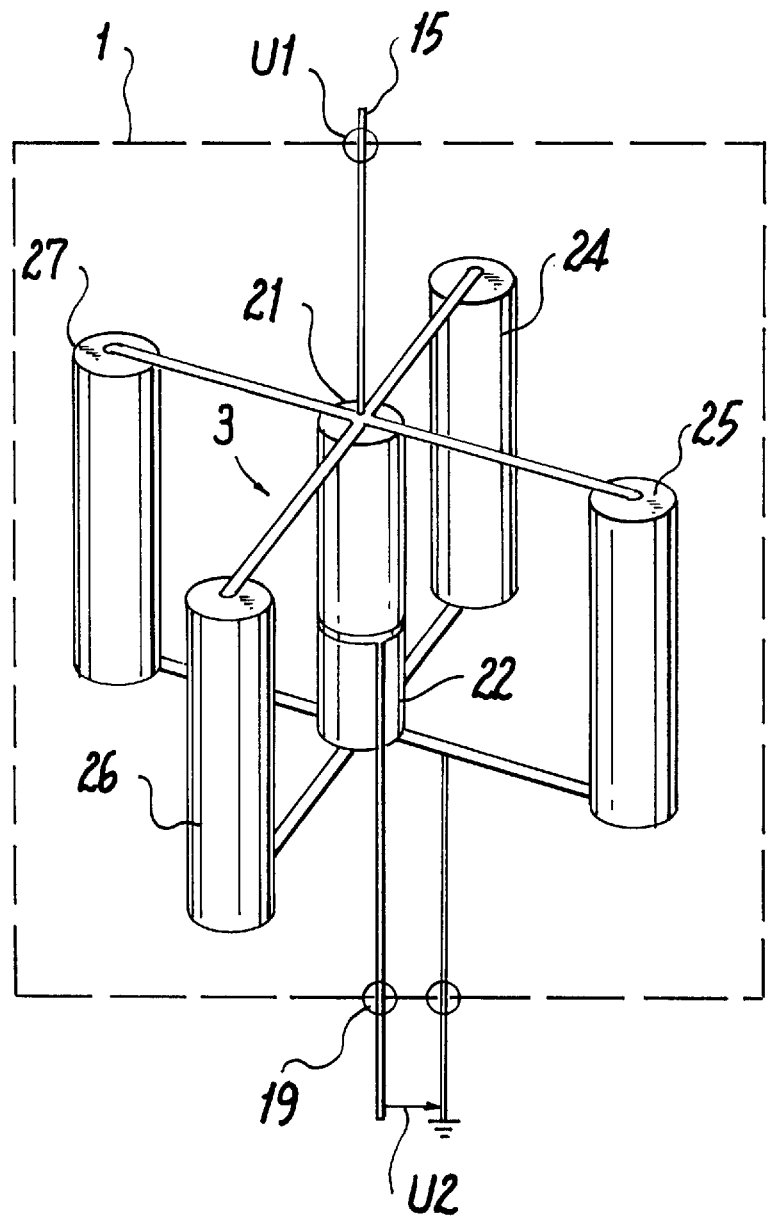

The voltage transformer represented in FIG. 1 has a voltage divider 1, which has a supporting plate 2 and a divider resistor 3 applied to the supporting plate 2 by means of thick film techniques. The divider resistor 3 is provided with taps 3, 4, 5, 6, 7, 8, 9 and has a section which is embodied as the measuring resistor 10. Three umbrella-shaped electrodes 11, 12, 13 are arranged around the voltage divider 1, which are capacitively effective in respect to each other or in respect to ground potential. A first electrode 11 is connected with the high voltage line 15, which in turn is connected with a first tap 4 of the divider resistor 3. A second electrode 12 is connected via a short conductor 16 with a second tap 5 of the divider resistor 3. A third electrode 13 is connected via a further short conductor 17 with a third tap 6 of the divider resistor 3. The three electrodes 12, 12, 13 are arranged stacked above each other.

All taps 4 to 9 are arranged at the edges of the supporting plate 2 of the divider resistor 3 in order to make possible a simple connection with the high voltage line 15, the short conductors 16, 17, the ground line 18 and the measuring line 19.

Furthermore, the dimensions of the electrodes are matched to the desired capacitance, so that capacitive effects of the environment are neutralized to a large extent.

Although the electrodes 11, 12, 13 in the examples shown are embodied as umbrella-shaped sheet metal elements, they can also be made in accordance with cast resin techniques, wherein the capacitively effective portion is made of a conductive synthetic resin layer or by sputter metallization.

In the equivalent circuit diagram in FIG. 1, a high voltage U1 is applied to the first tap 4 of the divider resistor 3. A first partial resistor R1 is formed between the first tap 4 and the second tap 5. A second partial resistor R2 is formed between the second tap 5 and the third tap 6. A third partial resistor R3 is formed between the third tap 6 and the fourth tap 7. The measuring resistor 10 is formed between the fourth tap 7 and the fifth tap 8. Finally, the ground line 18 is connected with the sixth tap 9. Among each other the three electrodes 11, 12, 13 constitute the capacitors C1, C2, C3. Outside of the supporting plate 2, a compensation capacitor 20 is connected parallel with the measuring resistor 10 to the fourth tap 7 and the fifth tap 8. The measuring voltage U2 is picked up via the measuring line 19.

A fourth cup-shaped electrode 14 is disposed in the exemplary embodiment in accordance with FIG. 1, which is connected with ground potential and encloses the third electrode 13 completely and the second electrode 12 partially. This fourth electrode 14 partially shields the voltage divider 1 and forms further capacitors C4 and C5 in respect to the second electrode 12 and the third electrode 13.

In the exemplary embodiment in accordance with FIG. 2 the fourth electrode is lacking and the three other electrodes 11, 12, 13 are slightly modified in their shape and arrangement, so that only the capacitors C1 and C3 result in the associated equivalent circuit diagram.

The described voltage transformer is suitable for voltages of approximately 12 kV (medium high voltage) and has a divider ratio of 1:10000, so that the measuring voltage lies in the range of 1V.

The voltage divider 1 can again be recognized in FIG. 3, which here consists of a high voltage resistor 21 and a low voltage resistor 22, between which a tap 23 is disposed. The measuring line 19 is connected to the tap 23, to which the measuring voltage U2 is applied. The high voltage U1 is supplied via the high voltage line 15.

Four further resistors 24, 25, 26, 27 are arranged around the divider resistor 3, which are switched parallel with the divider resistor 3 and are otherwise also arranged parallel with the latter. Because of this the further resistors 24 to 27 develop a defined semiconducting shielding effect for compensating ambient electromagnetic effects.

Figure 4:
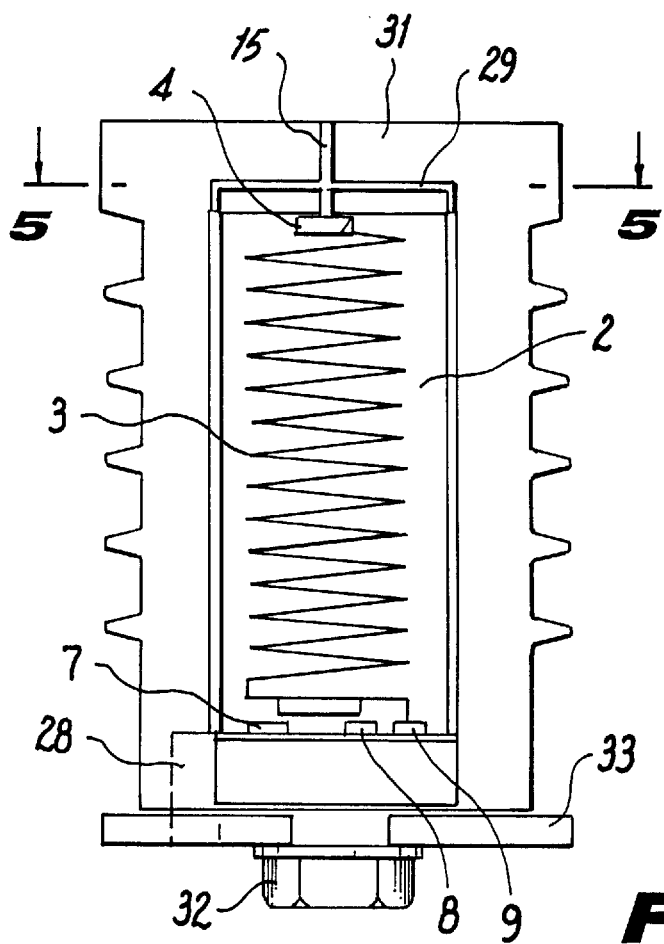
FIG. 4, is a representation in partial section of an exemplary embodiment of the third arrangement, FIG. 5, a section along line A—A in FIG. 4, FIG. 6, a representation, partially in section, of a further exemplary embodiment of the third arrangement, FIG. 7, a section along the line B—B in FIG. 6, FIG. 8, a top view on a further exemplary embodiment of the third arrangement.
Figure 5:
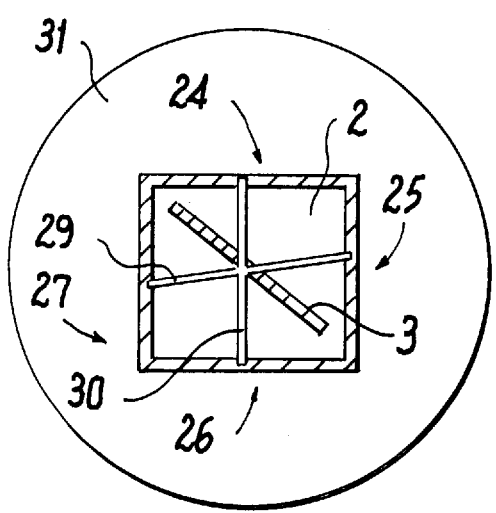

In the exemplary embodiment represented in FIGS. 4 and 5, the four further resistors 24 to 27 as well as the divider resistor 3, are respectively embodied in accordance with thick film techniques on a flat supporting plate 2 with taps 4, 7, 8, 9 at the edges of the supporting plate 2, wherein only the tap 7 of the divider resistor 3 is connected with the measuring connector 28. The high voltage line 15 is connected to the first tap 4 of the divider resistor 3, and via two connectors 29, 30 to corresponding connectors of the further resistors 24 to 27. As can best be seen in FIG. 5, the four further resistors 24 to 25 are arranged in a box shape around the divider resistor 3, so that in section their supporting plates 2 form a square in which the divider resistor 3 is diagonally arranged. Furthermore, the entire voltage transformer arrangement has been cast into the material of a support 31 for busbars. Such supports 31 are employed in switchgear as the insulating element and for fastening and supporting busbars, wherein the supports 31 are fastened by means of a fastening screw 32 to a bridge plate 33. The fastening screw 32 at the same time constitutes a ground connection with the tap 9 of the divider resistor 3. A busbar, not represented, is fastened on the top of the support 31 by means of a fastening screw, not shown, wherein simultaneously a contact with the high voltage line 15 is made.

The divider resistor 3 and the further resistors 24 to 27 are covered with silicon caoutchouc prior to being cast into the material of the support 31 in order to assure a small amount of play of the resistors 24 to 27 and the divider resistor 3 in respect to the material of the support 31 under a thermal load.

Figure 6:
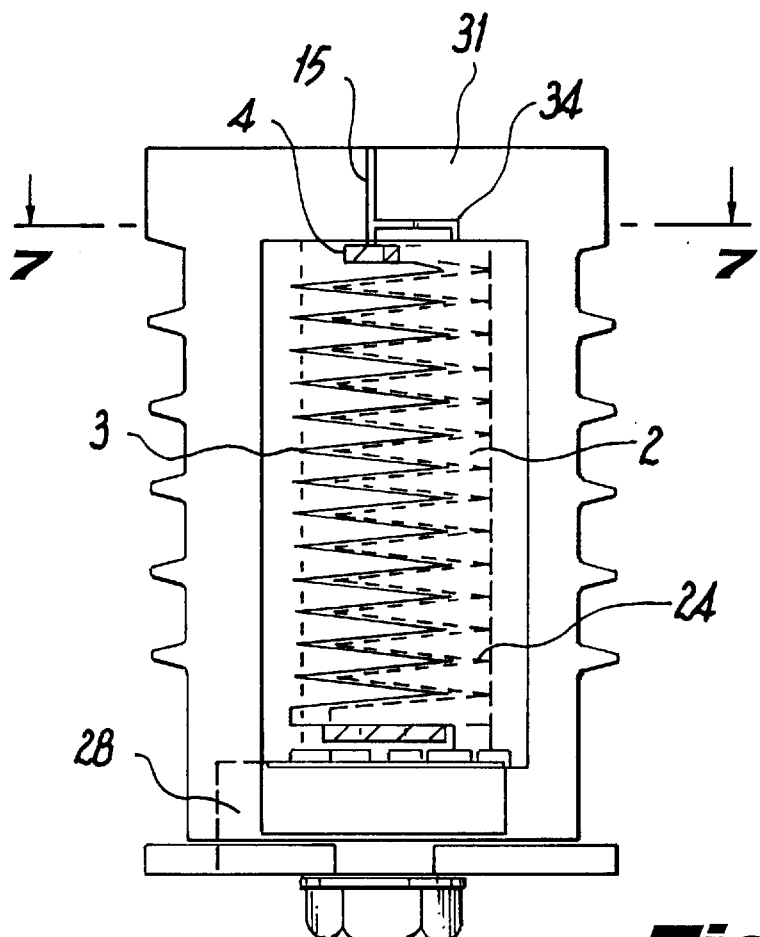
Figure 7:
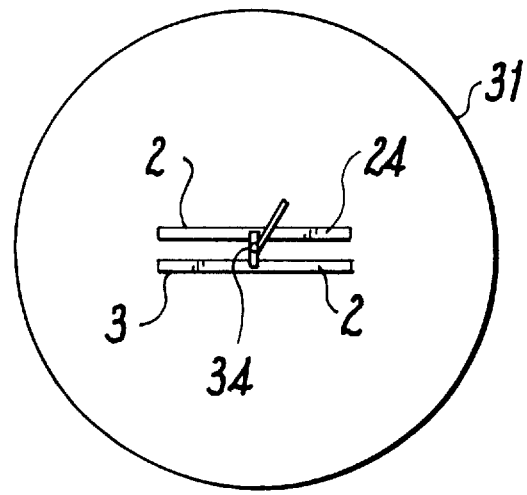

A support with a cast-in voltage transformer is again represented in FIGS. 6 and 7 which, however, in this exemplary embodiment is constituted by the divider resistor 3 and only one further resistor 24, wherein the two supporting plates 2 extend essentially parallel with each other at a short distance of approximately the thickness of one supporting plate. The high tension line 15 is connected via a connector 34 with the first tap 6 of the divider resistor 3 as well as with the corresponding tap the further resistor 24.

Figure 8:
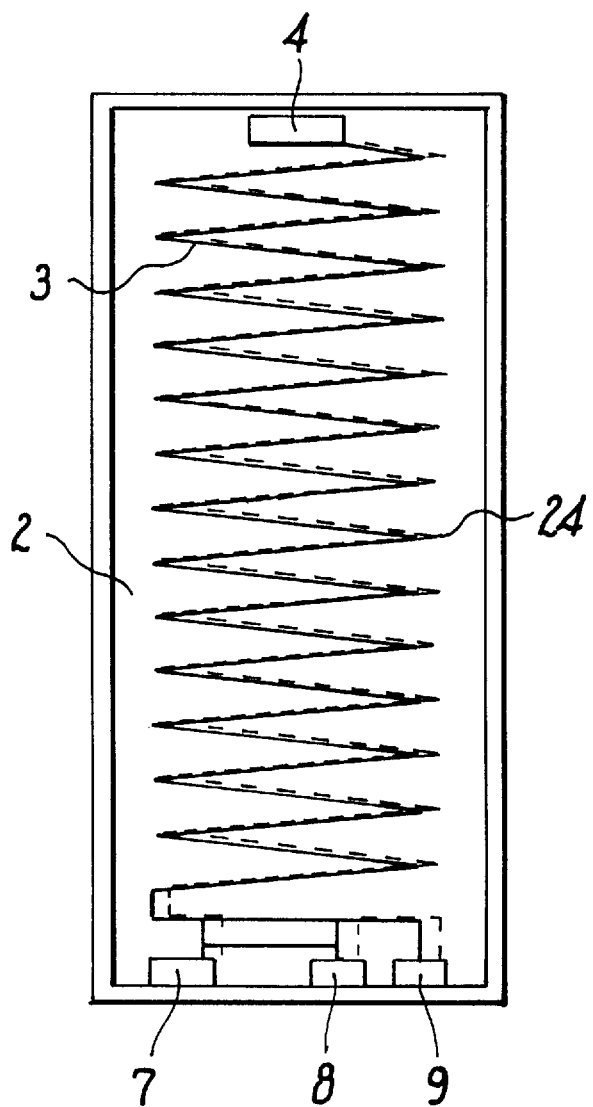

In the voltage transformer represented in FIG. 8, the divider resistor 3 is disposed on the front of the supporting plate 2, and on its back a further resistor 24. In this case the further resistor 24 is connected with the first tap 4 of the divider resistor 3, to which the high voltage is applied. The tap of the divider resistor 3 connected with the ground line is also in contact with the other end of the resistor 24. But the fourth tap 7 and the fifth tap 8, which are used for picking up the measuring voltage, are only connected with the divider resistor 3.

List of Reference Numerals

1 Voltage divider
2 Supporting plate
3 Divider resistor
4 First tap
5 Second tap
6 Third tap
7 Fourth tap
8 Fifth tap
9 Sixth tap
10 Measuring resistor
11 First electrode
12 Second electrode
13 Third electrode
14 Fourth electrode
15 High voltage line
16 Conductor
17 Conductor
18 Ground line
19 Measuring line
20 Compensation capacitor
21 High voltage resistor
22 Low voltage resistor
23 Tap
24 Further resistor
25 Further resistor
26 Further resistor
27 Further resistor
28 Measuring connector
29 Connector
30 Connector
31 Support
32 Fastening screw
33 Bridge plate
34 Connector
U1 High voltage
U2 Measuring voltage
R1 First partial resistor
R2 Second partial resistor
R3 Third partial resistor
C1 Capacitor
C2 Capacitor
C3 Capacitor C4 Capacitor
C5 Capacitor

I claim:

1. A voltage transformer with a voltage divider (1) for measuring the voltage in medium high voltage and high voltage installations, having a combined arrangement of an ohmic divider resistor (3) and means (11 to 14, 24 to 27) for compensating ambient electromagnetic effects, and the divider resistor (3) is made of one piece with a measuring resistor (10) and with taps (4 to 9), wherein at least one tap (4 to 9) is connected with at least one compensation element (11 to 14, 24 to 27).

2. The voltage transformer in accordance with claim 1, wherein the divider resistor (3) is arranged on a flat supporting plate (2) and the taps (4 to 9) at the edges of the supporting plate (2).

3. The voltage transformer in accordance with claim 1 wherein electrodes (11, 12, 13) are used as compensation elements, which are dimensioned in such a way that accidental capacitive effects and those based on the environment can be compensated to a large extent, in particular in that the capacitor at the low voltage resistor (10) has a defined relationship to the capacitor at the high voltage resistor (3).

4. The voltage transformer in accordance with claim 3, wherein the electrodes are produced in accordance with cast resin techniques, wherein the capacitatively effective part is made of conducting synthetic resin layers or by sputter metallization.

5. The voltage transformer in accordance with claim 3, wherein the capacitive electrodes (11, 12, 13) consist of suitably shaped sheet metal elements, which are connected over short conductors (16, 17) with the taps (4, 5, 6) of the divider resistor (3).

6. The voltage transformer in accordance with claim 3, wherein the capacitive electrodes (11, 12, 13) consist of umbrella-shaped metal elements.

7. The voltage transformer in accordance with claim 3, wherein the electrodes are designed in a semiconductor-capable embodiment, preferably with a surface resistance in the range between $10^8 \ldots 10^{11}$ Ω.

8. The voltage transformer in accordance with claim 5, wherein three umbrella-shaped electrodes (11, 12, 13) are arranged one on top of the other, wherein a first electrode (11) is connected with the high voltage (U1), a second electrode (12) with a second tap (5) of the divider resistor (3) and a third electrode (13) with a third tap (6).

9. The voltage transformer in accordance with claim 8, wherein a cup-shaped fourth electrode (14), which is connected with ground potential, is provided, which encloses at least the third electrode (13).

10. The voltage transformer in accordance with claim 8, wherein a cup-shaped fourth electrode (14), which is connected with the potential of the divider pick-up at the fourth tap (14), is provided, which encloses at least a portion of the divider resistor.

11. The voltage transformer in accordance with claim 1 wherein at least one further resistor (24, 25, 26, 27) is switched parallel with the divider resistor (3) as the compensation element and is disposed in its vicinity.

12. The voltage transformer in accordance with claim 11, wherein the further resistor(s) (24, 25, 26, 27) are embodied in the form of a metal material sputtered on a supporting material (2) or in accordance with thick film techniques.

13. The voltage transformer in accordance with claim 11 wherein the further resistor(s) (24, 25, 26, 27) are embodied in the same way as the divider resistor (3) on a flat supporting plate (2) with taps (4, 7, 8, 9) at the edges of the supporting plate (2), but wherein only the divider resistor (3) is connected with the measuring connection (28).

14. The voltage transformer in accordance with claim 13, wherein four further resistors (24, 25, 26, 27) are arranged in a box shape around the divider resistor (3), so that in section their supporting plates (2) essentially form a square, in which the divider resistor (3) is diagonally arranged.

15. The voltage transformer in accordance with claim 13, wherein a further resistor (24) is disposed directly next to the divider resistor (3), so that the two supporting plates extend essentially parallel with each other at a short distance from and essentially parallel with each other.

16. The voltage transformer in accordance with claim 13, wherein the divider resistor (3) and a further resistor (24) are disposed on the front and back of the same supporting plate (2).

17. The voltage transformer in accordance with claim 1 wherein the voltage transformer is cast in the material of an insulating element, in particular in an opening or a support (13) for busbars.

18. The voltage transformer in accordance with claim 17, wherein the resistors (24, 25, 26, 27) of the voltage transformer, and in particular the divider resistor (3), are covered with silicon caoutchouc.

19. A support for bus bars, in particular in switchgear, wherein a voltage transformer in accordance with claim 1 is cast into the material of the support (31).

20. The support in accordance with claim 1, wherein the resistors (24, 25, 26, 27) of the voltage transformer, and in particular the divider resistor (3), are covered with silicon caoutchouc.

21. The voltage transformer in accordance with claim 1, wherein the divider resistor (3) is made of one piece with a measuring resistor (10) and with steps (4–9) as a metal material sputtered on a supporting material.

22. The voltage transformer in accordance with claim 1, wherein the divider resistor (3) is made of one piece with a measuring resistor (10) and with steps (4–9) in accordance with thick film technology.

* * * * *